(12) United States Patent
Ramm et al.

(10) Patent No.: US 9,611,538 B2
(45) Date of Patent: Apr. 4, 2017

(54) METHOD FOR PRODUCING METAL OXIDE LAYERS THROUGH ARC VAPORIZATION

(75) Inventors: Jürgen Ramm, Maienfeld (CH); Beno Widrig, Bad Ragaz (CH)

(73) Assignee: OERLIKON SURFACE SOLUTIONS AG, PFAFFIKON, Pfaffikon SZ (CH)

(*) Notice: Subject to any disclaimer, the term of this patent is extended or adjusted under 35 U.S.C. 154(b) by 1062 days.

(21) Appl. No.: 12/429,252

(22) Filed: Apr. 24, 2009

(65) Prior Publication Data

US 2009/0269600 A1 Oct. 29, 2009

Related U.S. Application Data

(60) Provisional application No. 61/047,591, filed on Apr. 24, 2008.

(30) Foreign Application Priority Data

Sep. 19, 2008 (EP) .................................... 08016572

(51) Int. Cl.
*C01G 37/14* (2006.01)
*C23C 14/34* (2006.01)
(Continued)

(52) U.S. Cl.
CPC ........ *C23C 14/3414* (2013.01); *C22C 1/0416* (2013.01); *C23C 14/0036* (2013.01);
(Continued)

(58) Field of Classification Search
USPC ...... 423/595; 428/472.2; 204/192.12, 192.15
See application file for complete search history.

(56) References Cited

U.S. PATENT DOCUMENTS 5,246,787 A * 9/1993 Schulz et al. .............. 428/472.2
5,342,283 A * 8/1994 Good ............................. 600/8
(Continued)

FOREIGN PATENT DOCUMENTS

CH       688863 A5    4/1998
DE    19522331 A1    1/1996
(Continued)

OTHER PUBLICATIONS

T. Schemmel et al, "Process for High Rate Deposition of Al2O3," Vac-Tec Systems, Inc., Mar. 16, 1989.
(Continued)

*Primary Examiner* — Kaj K Olsen
*Assistant Examiner* — Ross J Christie
(74) *Attorney, Agent, or Firm* — Pearne & Gordon LLP

(57) ABSTRACT

The invention relates to a method for producing oxidic layers by means of PVD (physical vapor deposition), in particular by means of cathodic arc vaporization, wherein a powder-metallurgical target is vaporized and the powder-metallic target is formed of at least two metallic or semi-metallic components, the composition of the metallic or semi-metallic components of the target being chosen in such a manner that during heating in the transition from the room temperature into the liquid phase no phase boundary of purely solid phases, based on the phase diagram of a molten mixture of the at least two metallic or semi-metallic components, is crossed.

8 Claims, 10 Drawing Sheets

Figure 1:
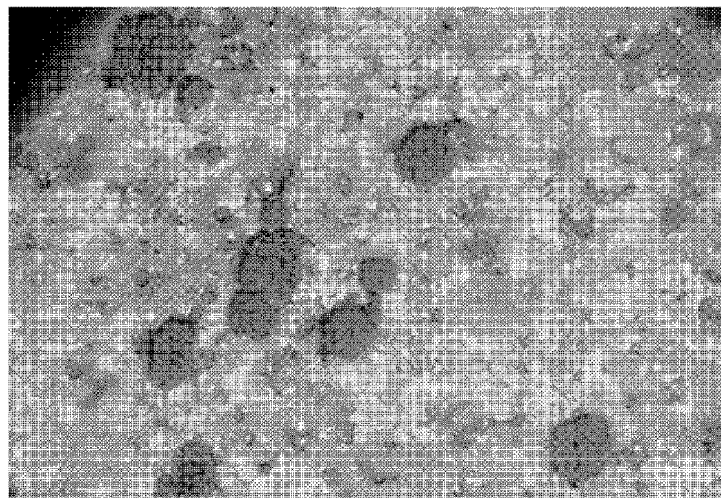

EHT=15.00 kV  Signal A=RBSD  WD= 16mm KAEV Mag= 100 X    100μm
File Name =#812-AIV85-15-OF-RL-01.jpg    Date: 12. Feb. 2008   H

(51) Int. Cl.
*C22C 1/04* (2006.01)
*C23C 14/00* (2006.01)
*C23C 14/08* (2006.01)
*C23C 14/32* (2006.01)

(52) U.S. Cl.
CPC ............ *C23C 14/08* (2013.01); *C23C 14/081* (2013.01); *C23C 14/083* (2013.01); *C23C 14/325* (2013.01); *B22F 2998/00* (2013.01); *Y10T 428/12028* (2015.01)

(56) References Cited

U.S. PATENT DOCUMENTS

| | | | |
|---|---|---|---|
| 5,415,829 A * | 5/1995 | Ohhashi et al. | 419/23 |
| 5,518,597 A | 5/1996 | Storer et al. | |
| 6,099,457 A * | 8/2000 | Good | 600/8 |
| 6,268,284 B1 * | 7/2001 | Cerio, Jr. | 438/643 |
| 6,602,390 B1 | 8/2003 | Brandle et al. | |
| 6,666,811 B1 * | 12/2003 | Good | 600/8 |
| 6,709,557 B1 * | 3/2004 | Kailasam et al. | 204/298.13 |
| 6,730,392 B2 * | 5/2004 | Vetter | C23C 28/044 428/216 |
| 7,144,547 B2 | 12/2006 | Yamamoto et al. | |
| 2003/0217917 A1 * | 11/2003 | Yamamoto | C23C 14/3414 204/298.13 |
| 2004/0058200 A1 * | 3/2004 | Chaput et al. | 428/702 |
| 2004/0121147 A1 | 6/2004 | Morikawa et al. | |
| 2004/0214437 A1 * | 10/2004 | Ramm | 438/689 |
| 2004/0242953 A1 * | 12/2004 | Good | 600/7 |
| 2005/0214579 A1 | 9/2005 | Tsushima et al. | |
| 2005/0223848 A1 * | 10/2005 | Ueno et al. | 75/351 |
| 2006/0046336 A1 * | 3/2006 | Shoji | H01L 27/1292 438/30 |
| 2006/0134390 A1 * | 6/2006 | Lin et al. | 428/194 |
| 2007/0000772 A1 | 1/2007 | Ramm et al. | |
| 2007/0206267 A1 * | 9/2007 | Tung et al. | 359/291 |
| 2008/0020138 A1 | 1/2008 | Ramm et al. | |
| 2008/0090099 A1 | 4/2008 | Ramm et al. | |

FOREIGN PATENT DOCUMENTS

| | | |
|---|---|---|
| EP | 1391533 A1 | 2/2004 |
| EP | 1700928 A1 | 9/2006 |
| JP | 2002-053946 A | 2/2002 |
| JP | 2003-286566 A | 10/2003 |
| WO | 2006/099758 A2 | 9/2006 |
| WO | 2006/099760 A2 | 9/2006 |
| WO | 2006099760 A2 | 9/2006 |
| WO | 2008009619 A1 | 1/2008 |

OTHER PUBLICATIONS

Sitte, "Investigation of the Miscibility Gap of the System Chromia" Graz, Austria, 1985, pp. 451-456.
Abstract of DE 19522331 dated Jan. 4, 1996.
Schemmel, et al., "Process for High Rate Deposition of Al2O3" Thin Solid Films, Boulder, CO., 1989, pp. 597-601.

* cited by examiner

EHT=15.00 kV  Signal A=RBSD  WD= 16mm KAEV Mag= 100 X  100μm
File Name =#802-gebraucht-RL-01.jpg   Date: 4. Feb. 2008

EHT=5.00 kV  Signal A=InLensWD= 1mm WEAL  Mag= 100.00 K X   200μm
File Name =#173_605_THM3_Bruch_REM_03.jpg  Date: 26. Jan. 2007

EHT=15.00 kV  Signal A=RBSD  WD= 18mm KAEV Mag= 100 X   100μm
File Name =AlCr_98_2_#843_RL_01.jpg  Date: 31 March 2008

EHT=15.00 kV  Signal A=RBSD  WD= 16mm KAEV  Mag= 100 X    100μm
Date Name =BAl1200-standard-neu RL-01.jpg    Date: 4. Feb. 2008

EHT=15.00 kV  Signal A=RBSD  WD= 18mm KAEV Mag= 100 X  100μm
File Name =AlCr_98_2_RL-OF01.jpg    Date: 28 March 2008  ⊢⊣

EHT=15.00 kV  Signal A=RBSD  WD= 17mm KAEV Mag= 100 X    100μm
File Name =#807-BAl1200-standard-RL-01.jpg   Date: 7. Feb. 2008

EHT=15.00 kV  Signal A=RBSD  WD= 16mm EGSI  Mag= 100 X    100μm
File Name =Neu_Targ_AIV65-35_OF_REM_01.jpg   Date: 8. Feb. 2008

EHT=15.00 kV  Signal A=RBSD  WD= 29mm EGSI Mag= 100 X    100μm
File Name =Neu_Targ_AIV85-15_OF_REM_01.jpg   Date: 8. Feb. 2008

EHT=15.00 kV  Signal A=RBSD  WD= 16mm KAEV Mag= 100 X    100μm
File Name =#811-AIV65-35-OF-RL01.jpg   Date:11. Feb. 2008

EHT=15.00 kV  Signal A=RBSD  WD= 16mm KAEV Mag= 100 X        100μm
File Name =GFE-kleiner 100-neu-01.jpg        Date: 4. Feb. 2008   ⊢⊣

EHT=15.00 kV  Signal A=RBSD  WD= 17mm KAEV Mag= 100 X        100μm
File Name =#806-GFE-kleiner 100-RL-01.jpg    Date: 7. Feb. 2008   ⊢⊣

EHT=15.00 kV  Signal A=RBSD  WD= 17mm KAEV Mag= 100 X    100μm
File Name =GFE-kleiner 63-neu-RL-01.jpg    Date: 4. Feb. 2008

EHT=15.00 kV  Signal A=RBSD  WD= 17mm KAEV Mag= 100 X    100μm
File Name =#805-GFE-kleiner 63-RL-01.jpg    Date: 6. Feb. 2008

METHOD FOR PRODUCING METAL OXIDE LAYERS THROUGH ARC VAPORIZATION

The invention concerns a method for producing metal oxide layers through arc vaporization according to the preamble of claim 1.

In particular, the invention concerns the production, selection and operation of so-called "alloy targets", i.e. targets consisting of at least two metallic and/or semi-metallic components and that serve as vaporization sources in cathodic arc vaporization.

The invention is of particular importance for "alloy targets" composed of metals with very different melting temperatures. This therefore concerns in particular targets that have aluminum as the low-melting metallic component.

These alloy targets are defined as having at least two metallic components but that can also exist as inter-metallic compound and/or mixed crystals.

A powder-metallurgical target in this case is a target that is produced from powders of metals, semi-metals, inter-metallic compounds, mixed crystals and where, after the production process (for example in a hot isostatic pressing (HIP) process), the powder particles in the microscope resolution can still be distinguished. A powder-metallurgical alloy target can thus be produced from a mixture of metal and/or semi-metal powders, from a powder of an inter-metallic compound or a mixture of metal and/or semi-metal powders and/or inter-metallic compounds. In contrast thereto, a cast-bonded metallurgical alloy target is a target where the primary metals resp. semi-metals form an inter-metallic phase. Characteristic for this is that the particles of the primary material can no longer be seen in the microscope resolution, i.e. they are no longer present.

In addition, there are so-called plasma-arc sprayed targets. These are targets that have been produced through plasma-arc spraying. A partial or complete formation of inter-metallic components of the primary materials can occur in these targets. Generally, however, the plasma-arc sprayed target can contain both particles as well as inter-metallic phases.

Cathodic arc vaporization is a method established for years that finds application in the coating of tools and components and with which a wide range of metallic layers as well as metal nitrides and metal carbon nitrides are deposited. For all these applications, the targets are the cathode of a spark discharge, operated at low tensions and high currents and with which the target (cathode) material is vaporized. Direct-current voltage supply is used as easiest and most economical power supply for operating the spark discharges.

More problematic is the production of metal oxides by means of arc vaporization. It is difficult to operate a direct-current spark discharge in oxygen resp. in an oxygen-containing atmosphere, in order to deposit oxidic layers for example on tools or components. There is then a risk that both electrodes of the direct-current discharges (on the one hand, the target as cathode as well as, on the other hand, the anode, that is often operated on earth potential) become coated with insulating layers. This leads, on the target (cathode), depending on the source design (magnetic field, location and type of gas inlet), to the electrically conductive zone onto which the spark runs constricting itself and finally to an interruption of the spark discharge.

T. D. Schemmel, R. L. Cunningham and H. Randhawa, Thin Solid Films 181 (1989) 597, describes a high rate coating process for $Al_2O_3$. The oxygen gas inlet was introduced in the substrate's vicinity after filtering of the spark. It is mentioned that the oxygen inlet after the filter in the vicinity of the substrate is important to reduce the target's oxidation and stabilize the spark discharge.

The production of oxidic layers is also described in U.S. Pat. No. 5,518,597. The patent comprises the layer deposition at increased temperatures and is based on the fact that the anode is also heated (800° C.-1200° C.) and the reactive gas is not introduced directly at the target. The high anode temperature keeps the anode conductive and enables a stable operation of the spark discharge.

In US2007/0,000,772A1, WO2006/099,760A2 and WO2008/009,619A1, the operation of a spark discharge in oxygen atmosphere is described in detail and the method is suggested with which a complete coating with an insulation layer impenetrable for a direct current (DC) on the cathode can be avoided.

US2007/0,000,772A1 and WO2006/099,760A2 describe primarily the operation of the spark source with pulsed current as an essential factor for keeping the cathode surface free from impenetrable oxide layers and ensure a stable spark discharge. Through the pulsing of the spark current, for which a special power supply is necessary, the spark is continually directed onto new paths over the target and prevented from moving only in preferred zones and the remaining target areas becoming coated with thick oxide (as is the case with "steered arc").

In WO2008/009,619A1, the operation of the spark discharge in oxygen atmosphere is described, wherein the cathode is provided with a preferably small magnetic field perpendicular to the target surface. This allows a regular spark course over the target surface and thus prevents a thick oxidation build-up of the target impenetrable for the direct current.

On the basis of these three prior art documents, it is possible to ensure a stable spark discharge over several hours in pure oxygen atmosphere. These methods work in a stable and reproducible manner for elementary targets and for bonded-cast produced targets.

The increasing use of arc vaporization for producing the most varied metal oxides requires a flexible and cost-effective target production. Many targets are produced in a method best known to the one skilled in the art by means of hot isostatic pressing (HIP). In case for example an Al—Cr target is to be made, a powder or powder mixture of the desired composition from the elements (here for example and in non-limiting way: Al and Cr) is sealed in a container that is subjected in vacuum to high temperatures in order to reduce air and humidity in the powder. The container is then sealed and subjected to high pressure at high temperature. This method reduces the inner voids and achieves a certain bonding of the powder. The resulting material has a uniform distribution as regards particle size and nearly 100% density.

It is an aim of the invention to propose a method for producing metal oxide layers through arc vaporization with which metal oxide layers can be deposited reliably and which can be executed as cost-effectively as possible.

The aim is achieved with a method having the characteristics of claim 1.

Advantageous further developments are indicated in the subclaims dependent from it.

A further aim is to propose a target for the production of metal oxide layers with which metal oxide layers can be deposited reliably, without inclusions or premature deterioration of the target, and which is cost-effective to produce.

The aim is achieved with a target having the characteristics of claim 8.

Advantageous further developments are indicated in the subclaims dependent from it.

A further aim is to propose metal oxide layers that can be deposited cost-effectively and reliably with any desired composition.

The aim is achieved with a metal oxide layers having the characteristics described herein.

Advantageous further developments are indicated in the subclaims dependent from it.

The inventive method proposes to generate oxidic layers by means of PVD by using a target, wherein the target consists of at least two metallic or semi-metallic elements which will later form the metals or semi-metals of the metallic or semi-metallic oxide layer, the composition of the target being chosen in such a manner that during heating in the transition from the room temperature into the liquid phase in this composition no phase boundaries of purely solid phases, based on the phase diagram of the (molten) mixture of elements, are crossed. In this perspective, theorizing, the heterogeneous powder-metallurgical target available is thus seen as a quasi-molten target.

However, since during use of this PVD process, in particular with powder-metallurgic produced targets, one does not wish to be limited to the metal oxide compositions that are determined through the above target composition where, in the phase diagram, the liquid phase is merely reached directly from one solid phase without crossing additional phase boundaries to further purely solid phases, one can according to the invention produce each desired metal oxide composition by first choosing the composition of the metallic and semi-metallic elements, where no phase boundaries of purely solid phases are crossed, then, from these, producing first components and finally, from these first components and if need be the pure metals, produce a target mixture with each desired final composition.

For example, if one has two metals A and B and wishes for both these metals to be present in the same proportions in the developing metal oxide, one first determines in the phase diagram whether, at a concentration of respectively 50% of the metals, the molten mixture of the metals at higher temperatures passes directly into the liquid phase without transition into a further solid phase. If this is the case, it is possible therefrom to produce a powder-metallurgical target with the same proportions of the metals A and B without having to risk the disadvantages discovered by the inventors.

If for these metals A and B a state is discovered where the mixture of both metals passes without a further solid phase into the liquid phase with A:B=75:25 and A:B=25:75, a first component X with a composition of 75 A and 25 B in the form of an inter-metallic compound is first produced and then the second component Y with A:B=25:75 also in the form of an inter-metallic compound is produced. Subsequently, these two components X and Y are crushed to powder. One of the components X or Y can, instead of an inter-metallic compound, also be a pure metal or semi-metal.

Thereafter a powder-metallurgical target is powder-metallurgically produced from the components X and Y, wherein the components X and Y are contained in the same proportions. Thus the corresponding distribution A:B=50:50 is achieved without however, when performing the PVD process and in particular the cathodic arc vaporization method, vaporizing components which when heated would pass through a second solid phase.

The invention furthermore makes possible a considerably better and more specific design of such targets as regards the oxide layers to be produced, in particular in relation to splatter reduction, stability at high temperature and crystalline structure.

Furthermore, based on the invention, specific target compositions can be defined that result in a marked increase of the melting point of low-melting materials for the purpose of producing binary, ternary and quaternary oxides and mixed oxides of higher composition (quinary, senary etc.) that are stable at high temperature.

Finally, the invention allows a nearly complete layer design of the layers to be synthesized as regards forming temperature, crystalline structure, phase composition and freedom from metallic parts.

In particular, on the basis of the present invention, aluminum oxide can be produced in corundum structure.

The insights for producing the target also apply to the use of these targets in reactive sputter processes, in pulsed reactive sputter processes (so-called High Power Pulsed Sputtering, for the reactive Modulated Pulsed Sputtering, for the reactive bipolar sputter (Twin Mag Sputtering)) but especially for reactive cathodic arc vaporization.

Figure 2:
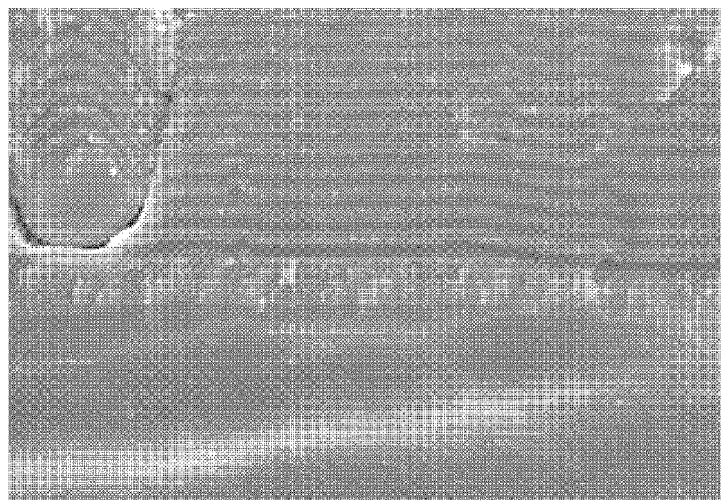
Figure 3:
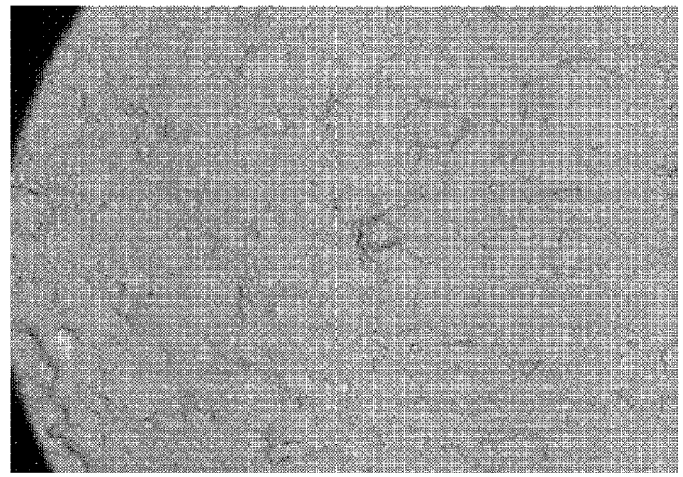
Figure 4:
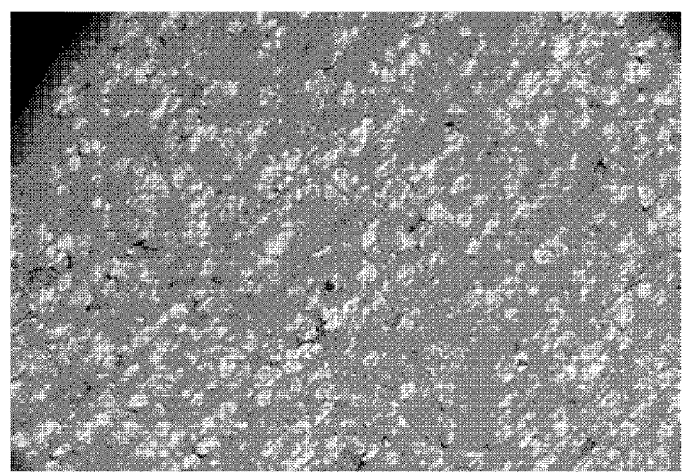
Figure 5:
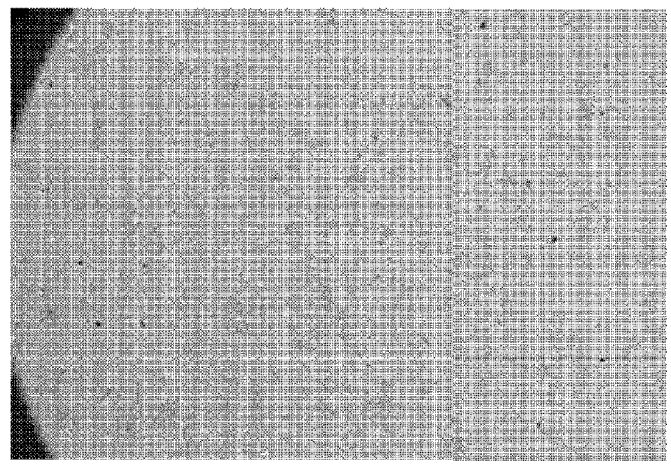
Figure 6:
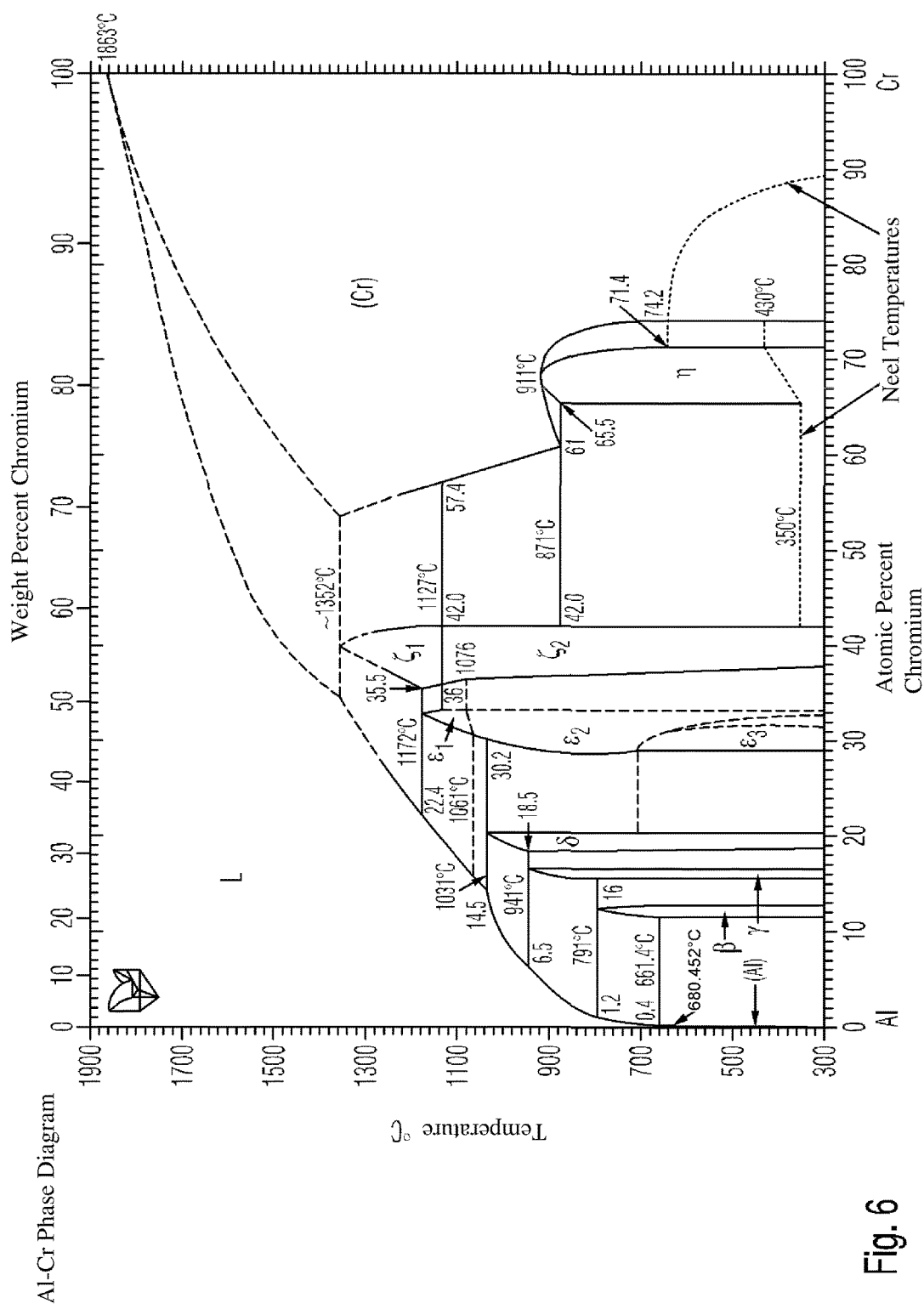
Figure 7:
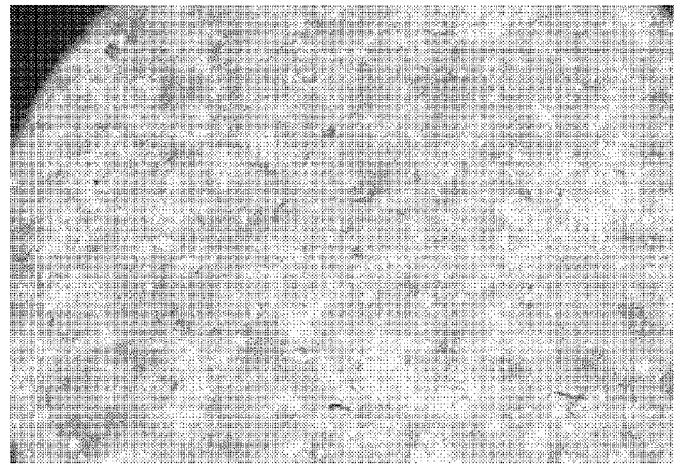
Figure 8:
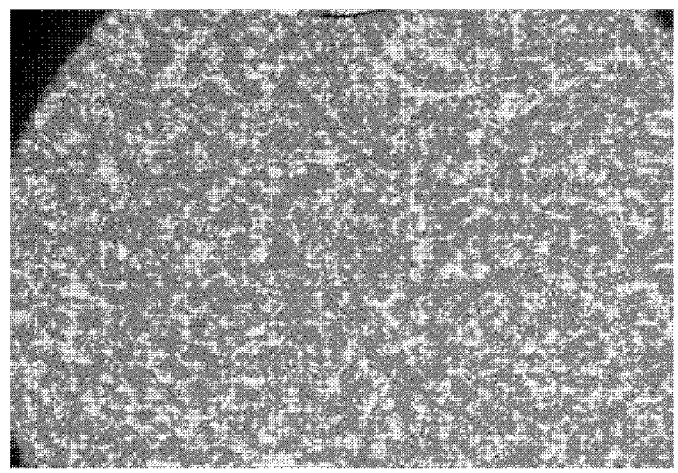
Figure 9:
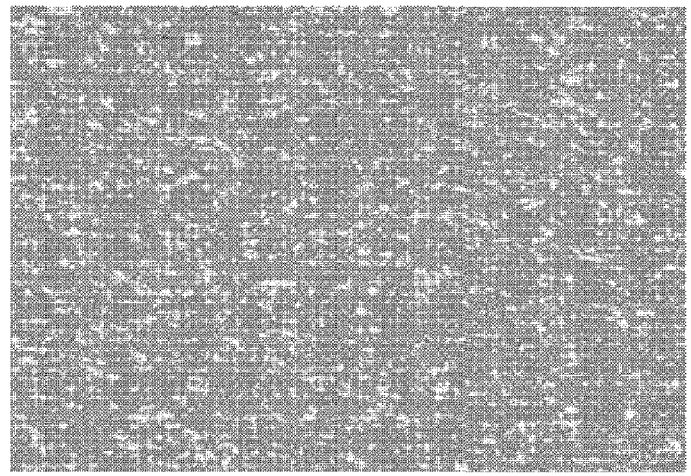
Figure 10:
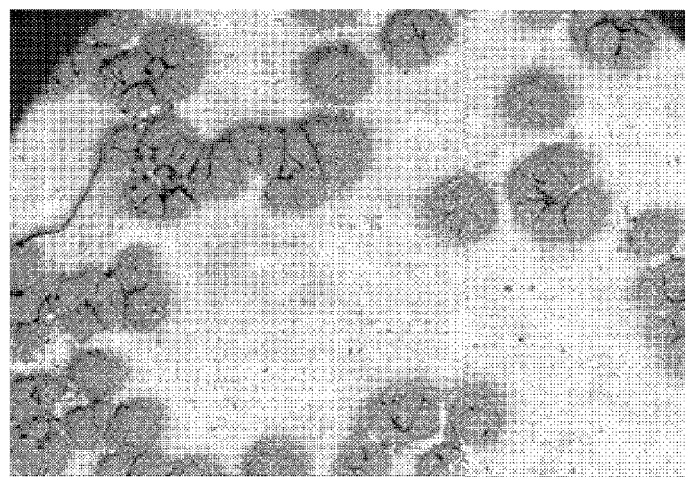
Figure 11:
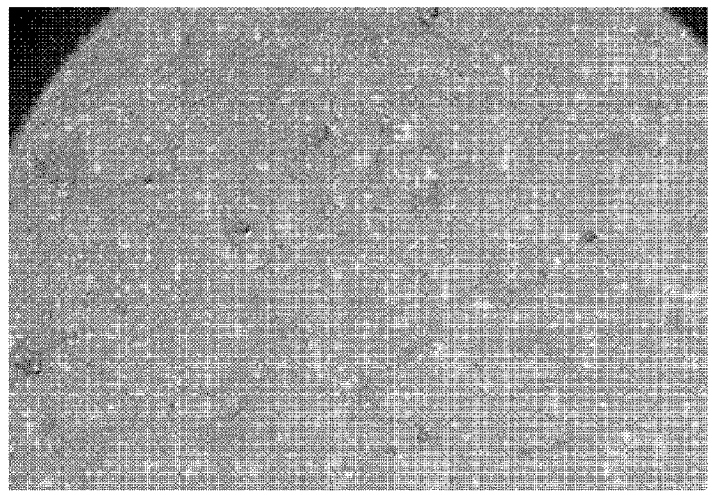
Figure 12:
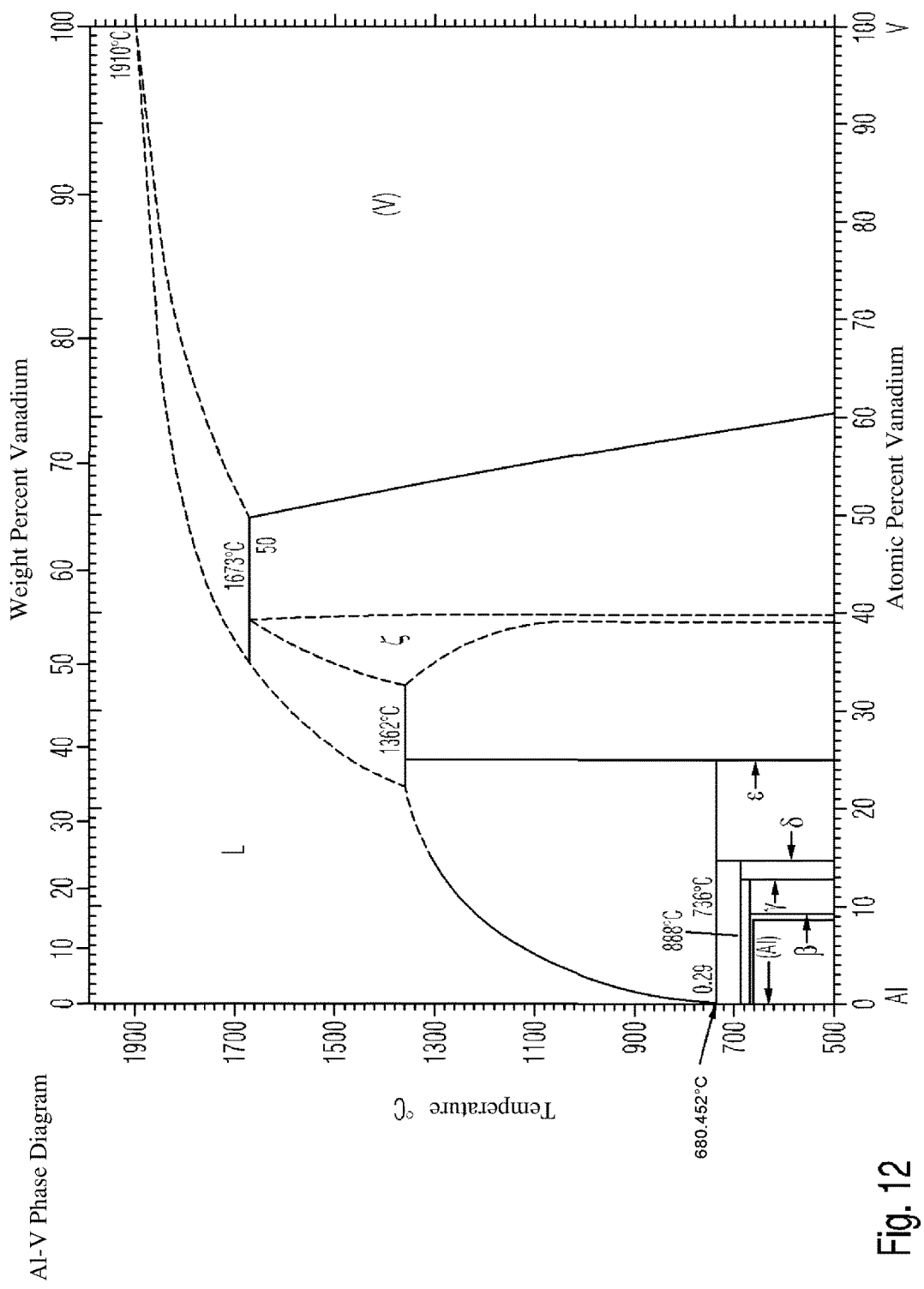
Figure 13A:
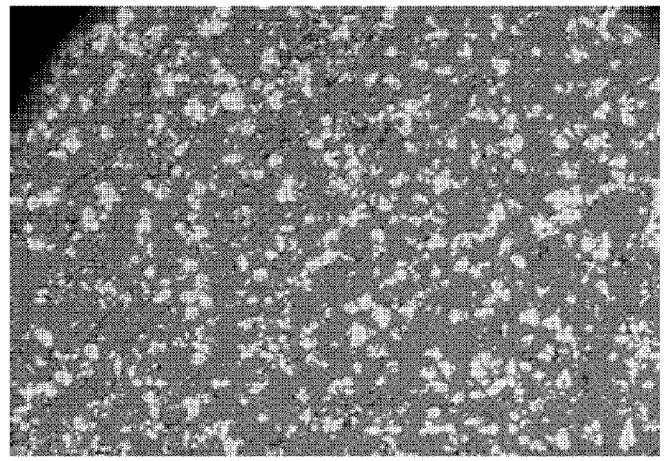
Figure 13B:
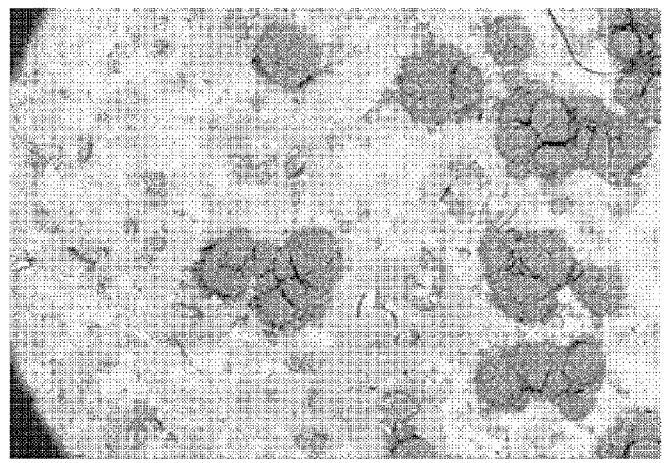
Figure 14A:
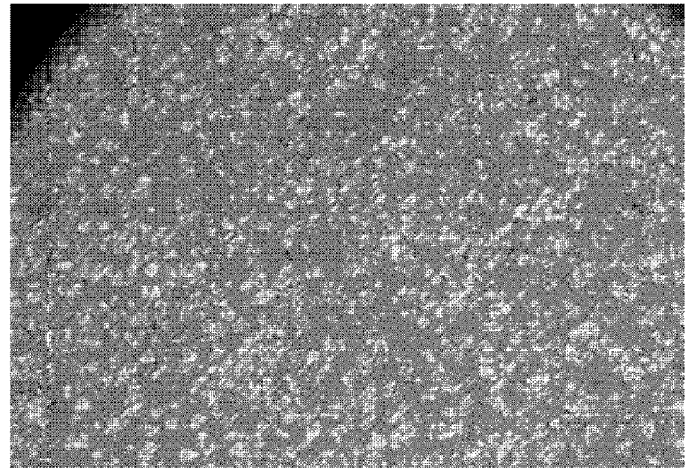
Figure 14B:
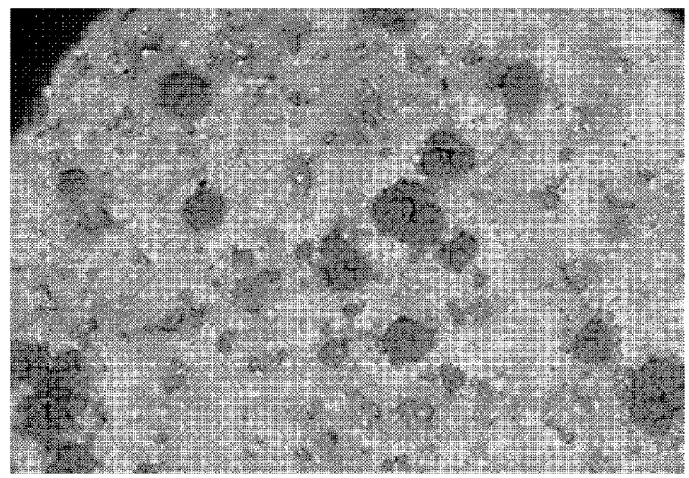

The invention will be explained by way of example on the basis of drawings, which show:

FIG. 1: the surface of an Al—Cr alloy target;

FIG. 2: the cross section of an Al—Cr—O/Al—Cr—N multilayer coat;

FIG. 3: a target surface of a bonded-cast produced Al—Cr-target;

FIG. 4: the surface of the target according to FIG. 1 before arc vaporization;

FIG. 5: the surface of the unused target B according to FIG. 2;

FIG. 6: a phase diagram for the binary compound of aluminum and chromium;

FIG. 7: the target A operated for one hour in oxygen with a gas flow of 300 sccm;

FIG. 8: the still unused target surface of an Al—V target;

FIG. 9: the surface of a still unused Al—V target with another composition;

FIG. 10: a target surface after one-hour operation;

FIG. 11: an Al—V target;

FIG. 12: the Al—V phase diagram;

FIG. 13*a*: an unused target surface;

FIG. 13*b*: the target surface according to FIG. 13*a* operated over one hour in 1000 sccm oxygen;

FIG. 14*a*: a target with a distribution maximum of 63 µm in unused state;

FIG. 14*b*: a target with an oxygen operation over one hour in 1000 sccm.

The inventors have realized that when using these targets for producing metal oxides by means of arc vaporization, problems generally arise for alloy targets that have been made through hot isostatic pressing, which point to a new, so far unknown type of "target contamination" different from the kind described in the above prior art. This type of "contamination" (oxidation built-up) of the target manifests itself in that during the arc vaporization, over time and depending on the oxygen partial pressure, insulating islands are formed on the target surface. The island forming does not lead, as for the above mentioned constricting, to a rapid interruption of the spark discharge or also to a clear destabilization of the spark discharge, but to a disturbed and spatter-rich spark operation and a strongly irregular target erosion, both of which are undesirable for the layer formation.

This island formation is undesirable especially in connection with the pulsed operating of the spark discharge, as it is described in US2007/0,000,772A1 and WO2006/099,760A2. The pulsed operation aims for a continual modification of the localized spark course on the target, in order to preserve the latter from the building-up of thicker oxides. However, if islands are formed on the target, the pulsing of the spark current will also lead to such islands becoming increasingly loosened from the target as splatters, as soon as the pulsing causes the spark's course to skim over these areas.

The effect of the oxide island formation can be seen especially in "alloy targets" that comprise materials of very different melting temperatures, for example Al and Cr. In FIG. 1, the surface of an Al—Cr "alloy target" with a composition of 70 at % Al and 30 at % Cr is represented (hereinafter referred to as target A), which has been operated for one hour in pure oxygen atmosphere and at a high oxygen partial pressure (2.8 Pa, oxygen flow 1000 sccm) in a vacuum installation for coating tools, of the type Innova of the company OC Oerlikon Balzers AG. The surface was recorded in a scanning electron microscope (SEM) by using the backscattered electrons that highlight in particular the material contrast, so that the differences in brightness make it possible to easily draw conclusions as to the different materials, their distribution and their size. Three brightness levels can clearly been distinguished on the target A in FIG. 1. The light zones are characteristic for the Cr areas, the smooth, darker zones for the Al regions. For the darkest, seemingly raised zones, a material analysis by means of energy dispersive X-ray spectroscopy (EDX) was performed, with which these islands have been identified as aluminum oxide.

These islands remain for a variable length of time on the target and disturb the spark course, since they are insulating and not penetrable for direct current and therefore cannot be vaporized. As already mentioned, the insulating islands increase in number and size over the time during which the spark is operated on the target, and further grow more strongly for higher oxygen partial pressure during arc vaporization. The island growth disturbs the free spark course on the target and leads to a shrinkage of the effectively vaporizable target surface.

The island formation also increases the risk that these will loosen from the target surface and leave a larger crater on the latter. There is thus, along with the oxide island formation, a kind of segregation of the target surface. This means that on the one hand the oxide islands on the target remain un-evaporated, grow and finally break free uncontrollably from the target (but are too large to become incorporated into the layer!), especially when the source operation is varied by pulsing the cathode current or varying the gas flow or gas type.

On the other hand, it is also observed that the component of the target that melts at a higher temperature, in this case chromium, is vaporized as metallic splatter and can be deposited in the layer. FIG. 2 shows the cross section of an Al—Cr—O/Al—Cr—N multilayer coat on which the integration of such a metallic splatter in the layer can be seen. The multilayer structure was achieved here by continuously changing the reactive gas, i.e. by switching from oxygen to nitrogen with uninterrupted spark discharge. This change of reactive gas leads to a modified spark course (entirely analogous to the pulsed operation of the target) on the target and thus to increased loosening of the oxide islands.

Without understanding the process more precisely, it appears there is a correlation between the metallic splatter formation and the growth of the oxide islands (i.e. a kind of segregation). This "segregation" is disturbing for the spark operation on the cathode, but also undesirable for the layer deposition, since splatters influence the layer mechanically, react chemically in uncontrolled fashion at higher temperatures and thus possibly weaken their high-temperature properties.

The following disadvantages thereby arise if targets powder-metallurgical produced by the synthesis of metal oxides by means of cathodic arc vaporization are used:
1. separate existence of the starter powder according to the HIP method, i.e. no mono-phase target, no intimate binding of the powder;
2. formation on the target of oxide islands that consist of one of the two or of a mixture of the components of the target and that can lead to the integration of metallic splatters in the deposited layer;
3. danger of a segregation on the target surface and of a strong target erosion through explosion-like loosening of the oxide islands when the spark current is pulsed and when switching between different reactive gases.

In connection with these disadvantages, there are accordingly also limitations for the synthesis of binary, ternary and quaternary or higher order metal oxides:
1. increased splatter formation in oxide layers of powder-metallurgical targets during arc vaporization, in particular in case the melting points of the metallic components are very different;
2. limitation to a certain process window as concerns the oxygen flow with the risk of a certain under-stoichiometry of the synthesized layers regarding oxygen;
3. insufficient control over the layer quality (hardness, morphology, structure) through uncontrolled island growth on the target and consequently uncontrolled integration of metallic splatters in the layer.

In FIG. 3, a target surface is shown that has also been operated for one hour under the same oxygen flow (1000 sccm) and with the same spark current as the target A in FIG. 1. This target is also an Al—Cr target, which in contrast to target A is not powder-metallurgical but bonded-cast produced. Additionally, this target has a composition of Al(98 at %)/Cr(2 at %) (hereinafter referred to as target B). In contrast to target A, target B shows no oxide island formations.

Targets for oxide production, constituted of a single crystalline phase, are described in CH00/688,863. However, this does not address the issue of an oxide island formation but the possibility at all of being able to operate such a mono-phase target in an atmosphere containing oxygen.

On the basis of this prior art and own observations, it has now been discovered according to the invention that the target production method could have an influence on the oxide island formation. This assumption is substantiated when the surfaces of the target before the arc vaporization are compared in SEM micrographs. In FIG. 4, the surface of the target A before the arc vaporization, also unused, is shown. The embedding of the lighter areas of Cr in the darker Al matrix can clearly be seen in the SEM micrograph.

By way of comparison, the surface of the unused target B is represented in FIG. 5. In contrast to target A, separate areas of the primary materials Al and Cr can hardly be seen, which is also not surprising, because a bonded-cast production results in a uniform phase resp. mixed crystal of the primary materials.

Although the HIP method allows freedom in the miscibility of the powders, the bonded-cast production of alloy targets is possible only in certain compositions. These mixing ratios can be evaluated roughly on the basis of phase diagrams of binary metallic compounds (for targets composed of two metallic components) known to the one skilled in the art.

In FIG. 6, such a phase diagram for the binary combination of Al and Cr is indicated. Consequently, the bonded-cast target should have been produced with 2 at % Cr in Al at approx. 800° C. The melting point of Al is at about 660° C., i.e. Al must be heated beyond the melting point in order to achieve the required Cr concentration in the target. Thereupon, cooling should then occur as fast as possible in order for this concentration to "freeze" and for no segregation of the materials to occur because of the different vapor pressures. This is all the more critical the higher the target production temperature is above the melting temperature of the low-melting component.

If it were then wished to produce the target A in bonded-cast manner, it would be necessary for a 30 at % Cr ratio to heat an Al—Cr mixture to over 1200° C., keep its composition constant (which is difficult, since Al at this temperature already has a high vapor pressure) and then cool it as fast as possible in order to "freeze" the compound. According to the invention, it is thus much easier to mix together a powder mixture and process it with the HIP method than to control the complicated bonded-cast production process for the same target.

In the frame of the invention, it has been discovered that the following disadvantages arise when using bonded-cast produced targets for the synthesis of metal oxides by means of cathodic arc vaporization:
1. no free choice in the composition ("interdicts" on the basis of the phase diagrams!);
2. complex and expensive production process;
3. adaptation of the production process to the particular target composition (temperature, cooling time, taking into consideration the different vapor pressures);
4. no synthesis of binary high-melting oxides possible over the mono-phase binary alloys (i.e. the production of $Al_2O_3$ in corundum structure from a mono-phase binary target).

There is thus a need for targets that combine the freer miscibility and simpler production technology of the powder-metallurgical targets, as compared to bonded-cast produced targets, with the "mono-phase" behavior during oxidation and the prevention of oxide island formation of the bonded-cast produced targets.

With the invention, instructions for the composition of targets is provided, based on the phase diagrams for binary alloys for powder-metallurgical alloy targets, in order to determine certain formation temperatures of the oxides and their phase mixtures.

The invention has the aim of avoiding oxide island formation as well as of reducing the splatters during production of oxide layers by means of cathodic arc vaporization. During the development, a multitude of different targets was investigated that had different compositions with respect to their materials, to their concentration and to the powder particle size.

First, a process window was determined in which the oxide island formation could be examined particularly well. In order to explain this, the target A should again be observed. In FIG. 7, the target A was also operated during one hour in pure oxygen, but only with a gas flow of 300 sccm. The resulting surface as compared with the operation in pure oxygen flow of 1000 sccm (FIG. 1) exhibits considerably less oxide island formation than is the case with a higher oxygen flow.

Similar tests were also carried out with other target compositions of the same material system, for example with Al(50 at %)/Cr(50 at %), Al(85 at %)/Cr(15 at %) and Al(25 at %)/Cr(75 at %). The oxide island formation for all these targets, at that gas flow, was only slight or not visible. The oxygen content in the oxide layers synthesized in these trials was determined by means of Rutherford Backscattering Spectroscopy (RBS) and was between (Al,Cr)2O2.80 and (Al,Cr)2O2.05, so that one can conclude, in the frame of the measuring accuracy of this method, to layer stoichiometry. However, the content was always on the side of oxygen deficit. This result can be explained with the metallic splatters in the layer, which (see FIG. 2) are not oxidized throughout. For the stoichiometry in the layers that were deposited with 1000 sccm, similar results were obtained.

Furthermore, powder-metallurgical targets from different particle sizes were also produced and examined. FIG. 13 illustrates the unused target surface (a) and the target surface (b) operated over one hour in 1000 sccm oxygen as in FIG. 1. The target producer indicates for the particle size a distribution maximum of approx. 100 μm. In FIGS. 14(a) and 14(b), targets with a distribution maximum of 63 μm were investigated. In both cases, the effect of the oxide island growth is shown clearly. This experience was made for targets with a particle size range of the powder between 10 μm and 300 μm.

For other materials as well, the window for the oxide island formation had to be determined. For this, material systems such as TiAl, AlV, AlNb, AlHf, AlZr, AlZrY, AlTa as well as for a series of other target mixtures constituted of the III and IV main group and of the $4^{th}$, $5^{th}$, $6^{th}$ B-group were examined and in most cases, during operation at 300 sccm, none or only the rudiments of oxide islands were found, at 1000 sccm either strong island growth or, surprisingly, no island growth.

This surprising result, that island growth can be avoided even when working with large oxygen flows, eventually allowed not only a method according to the invention for specific target design for metal oxides but, based on these insights, also a method unknown so far for specific synthesis of oxidic layers.

In experiments, in the cases where no island growth occurred even at 1000 sccm, the oxygen flow was first increased up to the limit of the oxygen flow of 1600 sccm possible with the pump system (corresponding to a pressure of approx. 5 Pa). But even under these conditions, no oxide island growth could be achieved for these targets, which was completely unexpected. Finally, for all materials the oxygen flow of 1000 sccm was used when operating a target.

The trigger for a possible comprehension was given, as already mentioned above, by the behavior of the bonded-cast targets, on which no oxide islands formed even at 1000 sccm. The extended mono-phase of the target was one possible explanation for the prevention of binary oxide island depositions, i.e. the oxide formation of the low-melting metallic target component. On the basis of the Al—Cr phase diagram in FIG. 6, the temperature should be about 800° C. to release 2 at % Cr in 98 at % Al. Then the Al—Cr mixture should be quickly cooled in order to "freeze" these 2 at % Cr in the 98 at % Al, since, during cooling in the thermal equilibrium, such a high Cr content could not be achieved.

Phase diagrams in T. B. Massalski, Hugh Baker, L. H. Bennett and Joanne L. Murray, Binary Allow Phase Diagrams, American Society for Metals, ISBN 0-87170-261-4, describe the phases and phase conversions that take place in thermodynamic equilibrium and thus can be used only very conditionally or not at all for describing such a fast cooling.

If the still unused surface of a powder-metallurgical produced target is observed (FIG. 4 for target A), it can clearly be seen that the material is not mono-phase but that the powders are still very much separated from one another.

This does not apply only to the Al—Cr system. In FIG. 8, the still unused target surface of an Al(65 at %)-V(35 at %) target and, in FIG. 9, the surface of a still unused Al(85 at %)-V(15 at %) target are represented. In both cases, both materials Al and V can clearly be recognized also here on the basis of the difference in brightness. One would of course also expect that oxide island growth on the target surface would occur in both cases if these targets were operated in 1000 sccm oxygen.

It was all the more surprising that oxide island growth could be observed only on the Al(65 at %)-V(35 at %) target, as represented in FIG. 10. On the surface of the Al(85 at %)-V(15 at %) target represented in FIG. 11, no oxide islands could be detected.

In order to verify this surprising result, a series of further powder-metallurgical targets were investigated, wherein different materials and their composition were varied. Finally, the particle size of the primary powders was modified in order to understand the nature of the oxide island formation.

Although arc vaporization is a far cry from quasi-static equilibrium processes, a possible explanation was sought on the basis of the phase diagrams.

For this, the Al—Cr material system should be observed on the basis of the phase diagram in the usual manner, i.e. coming out of the melt, i.e. coming out of high temperatures. With a 30 at % Cr ratio at approx. 1300° C. one reaches a zone of coexistence between liquid and solid phase, consisting of the ξ1-phase and the mixed crystal. At low temperatures, one crosses the zones of solid ξ1, ξ2 and ξ3 phases.

Assuming that the phase diagram were also to describe more or less very fast disequilibrium processes (occurring quasi adiabatically) as regards the temperature, it would be necessary during fast vaporization to cross all these phases before melting the material and vaporizing it at a useful rate.

Crossing the zones of different solid phases can lead to whatever kind of segregation of the metallic components and for example to a release of aluminum, preferably at the particle boundaries, and to a fast oxidation of Al even before the phase resp. the phase mixture in its entirety had reached melting temperature.

The same argumentation would apply to a composition of Al(50 at %)/Cr(50 at %) or for example also to a target composition of Al(27 at %)/Cr(73 at %). Here too oxide island growth is observed. Yet it is not as pronounced, probably because the release of metallic Cr, which can naturally occur also in phase transitions, is generally less critical for the arc operation of the target and its contamination, since the oxide formation with chromium takes place at much higher temperatures.

According to the invention, concentrations of the metallic components for the target will be sought for which, starting from below the melting temperature of the low-melting metallic component, at increasing temperatures only a single transition from the solid phase to a phase with liquid component will take place.

Such concentrations are to be found in particular when the solubility of the solid components is essentially independent of the temperature over a wide range of temperatures.

Examples for zones that have no detectable island growth even after 5 hours' operation of the targets in 1000 sccm oxygen had Cr target proportions of 15 at % and 18 at %, i.e. those zones in the phase diagram where a modification of the phase mixture takes place only in the zone where solid and liquid phases coexist. It was in that case irrelevant whether an additional transition from a solid-liquid coexistence phase to a further solid-liquid coexistence phase had to be crossed in order to reach the completely liquid phase.

Samples for other zones of the phase diagram resulted under the above described process conditions in easily detectable island growth from aluminum oxide or chromium oxide.

The zone for Cr ratios above 75 at % is also free of island growth, since in this zone the Al solubility in Cr in parallel to the temperature axis over the entire course in the liquid phase remains constant. The insight that this however also functions in other zones as long as it can be ensured that starting from below the melting temperature of the low-melting metallic component, at increasing temperatures only a single transition from the solid phase to a phase with liquid component will take place, is a further aspect of the present invention.

As the phase diagram of an Al—Nb system for example shows, such useful zones are at a Nb concentration essentially >0.5 at % to 60 at % and from 93 at % to essentially <99.5 at %. The pure metals (Nb 0 at % (corresponding to Al100 at %) and Nb 100 at %) are excluded, since according to the invention at least two metallic elements must be available to influence the melting point.

For Al—V material systems (see phase diagram FIG. 12), this hypothesis has now also been verified. For 35 at % V ratio, it is necessary to go through a phase mixture of the phase and ξ phase, further through the ξ phase, in order only then to reach a zone where solid and liquid coexist, consisting of mixed crystal and ξ phase. This means it is necessary to cross zones of different solid phases before reaching the coexistence zone of liquid and solid phase, and consequently before separations occur which, if the hypothesis is correct, form oxide islands.

At 15 at % V ratio, the situation is different. From an existing δ and ε phase mixture, a coexistence between liquid and solid phase, consisting of mixed crystal and ε phase, is reached directly. For this target, no oxide island growth could also be observed.

Therefore, the transition during heating should not take place over phase boundaries of purely solid phases, if one wishes to avoid the formation of oxide islands and also to reduce the integration of the metallic splatters in the layer.

The trials were repeated for a multitude of targets prepared according to the invention and there never was any oxide island formation.

For example, this assumption was verified and could be confirmed on the Al—Nb material system, e.g. with Al(80 at %)/Nb(20 at %).

No visible oxide island formation also resulted with:
Ti(20 at %)/Al(80 at %) targets,
Al(86 at %)/Zr(14 at %) targets,
Al(80 at %)/Hf(15 at %) targets,
Al(80 at %)/Zr(20 at %) targets,
Al(60 at %)/B(40 at %) targets.

Operating the spark discharge in pure oxygen atmosphere can modify the zones of coexistence of solid and liquid phase as regards the temperature and possibly bridge narrow temperature zones for phase formation close to the melting point of the low-melting metal.

Based on the empirical explanation for the mechanism of oxide island formation on the target, yet another mechanism for arc vaporization that concerns the formation of the oxide layer to be synthesized (not the islands on the target!) can be explained.

It is the formation of binary metal oxides from a powder-metallurgical target with two metallic components. The melting temperature and thus the formation temperature of the corresponding oxides can be set through the composition of the target, as soon as there are no essential segregations through the phase transitions. This arises from the previously described investigations that illustrate that the phase diagrams somehow can be drawn upon for explaining the cathodic spark. In other words: arc evaporation of powder-metallurgical targets allows to determine the stoichiometry of the metal oxide to be synthesized and of the corresponding phase or the corresponding phase mixture. Obviously, from a thermodynamic point of view, these oxides are generally not stable at normal temperature, but they are stable at temperatures of their formation temperature and mostly also above.

By way of example, let us consider again the Al—Cr material system. With a concentration of Al(70 at %)/Cr(30 at %), one expects on the basis of the phase diagram a transition into the melt with corresponding increased oxidation propensity and vaporization propensity at around 1300° C. In case this oxide is formed at this temperature or above, according to the phase diagram for the ternary Al—Cr—O [9] it should have a corundum structure. This is the case, as demonstrated on the basis of radiograms and also as described in WO2008/009,619A1. Other phases of the molten materials would only be possible in case there is a perceptible segregation at the target surface, which would then result in a modified melting point and would be reflected in the layer stoichiometry. Other phases (excepting metallic splatters!) could not be found, neither by means of X-ray diffraction nor with the considerably more sensitive method of electron diffraction in an irradiant electron microscope.

However, there are also in the Al—Cr phase diagram zones where the transition into the liquid phase happens under the formation temperature of the ternary mixed crystal oxide. A phase mixture should then form from the binary oxides.

In order to verify this hypothesis, layers were produced with a target having a concentration Al(85 at %)/Cr(15 at %). On the basis of the phase diagram, the following situation will then arise. One finds oneself in the zone either of the β and γ phase or of the γ phase alone, and then in the zone of the δ phase in coexistence with the liquid phase. The complete transition into the liquid phase with complete oxidation would then occur at approx. 1000° C. It is known from the phase diagram of the ternary Al—Cr—O [9] that at this temperature, the binary oxides are present still in separate phases. The forming $Al_2O_3$ at approx. 1000° C. should have the corundum structure. It must be added that the crystallite size in these layers is small and that therefore no Bragg reflection can be seen in the X-ray spectrum. With electron diffraction, however, the corundum structure of the aluminum oxide could be demonstrated. This result could also be confirmed for an Al(80 at %)/Cr(20 at %) target, although in this case the corundum structure of the $Al_2O_3$ was even more pronounced. In both cases, no oxide islands were formed on the target surface, which according to the explanations above was to be expected. With an elementary aluminum target, no corundum structure could understandably be achieved, since the transition in the liquid phase already occurred at 660° C., i.e. was too low to form the corundum lattice structure.

This increase of the melting point of Al for the purpose of forming the corundum structure of $Al_2O_3$ can take place in a wholly analogous way also in other material systems. For example, with a powder-metallurgical Al target that contains approx. 4 at % Nb or with a powder-metallurgical Al target that contains approx. 4 at % V or 2 at % Zr or 8 at % Hf, as can easily be gathered from the binary phase diagrams of the metallic components. Whether the respective binary oxide then forms or whether the formation of ternary oxide or mixed oxide occurs will depend on the phase equilibrium diagrams (binary of metals compared with ternary of metal oxide), which can then again be understood in wholly analogous way to the example for Al—Cr—O.

In case these phase equilibrium diagrams have not been measured yet, it is still possible to choose the experimental way, through variation of the target composition, in order to achieve specific structures.

In summary, it can be said that during arc vaporization for the synthesis of oxides, through the target composition of the metallic component, a formation temperature of the possible oxide or oxides corresponding to the phase diagram can be set in such a way that even high-temperature phase of binary oxides can be produced. The oxide island formation on the targets can however not be prevented for certain concentration ratios (in case the transition occurs through several solid phases into the liquid-solid coexistence phase). In this description, it has been disclosed how it is possible, on the basis of the phase diagram, to decide where it does not take place, i.e. how corresponding targets are to be built in order to avoid the problem of oxide island formation.

Since it is desirable both for the synthesis of ternary oxides as well as for the specific synthesis of binary oxides stable at high temperatures to freely choose the target composition without risk of oxide island formation on the target, a method will now be proposed that enables this in most cases for the entire composition range of powder-metallurgical targets.

By way of example, the binary Al—Cr phase diagram is again used to explain the basic approach, although for this particular example of application it has certain limitations. The solution is based on the one hand on the insight that in arc vaporization, although in the case of a powder-metallurgical target the particles of the metallic component are still clearly separated from one another, the melting point of the component mixture is more or less reached according to the binary phase diagram in order for the oxide to form. On the other hand, it is based on no oxide islands being formed during transition of a single phase into the melt (see bonded-cast target).

If one then wishes to make a target that allows an Al—Cr—O layer with respectively 50 at % of the metallic component to be produced, this target will according to the invention be mixed together from powders of the mixed crystal powders that are possible and can still be produced without problems, i.e. for example of Al with 2 at % Cr (bonded-cast powder) and Cr with 10 at % Al (bonded-cast powder) or other possible compositions in appropriate ratios, which can be found for practically every binary system.

A further method for producing such targets is based on the method of the plasma splatter, wherein also in certain areas the powders can be freely mixed and nevertheless high temperatures can be achieved in order to mix and quickly deposit the metallic elements.

According to the invention it has been discovered that arc vaporization occurs "fairly adiabatically" and that it is thus possible to use the phase diagrams as rough orientation. The layers are preformed resp. formed on the target in the substrate temperature range in which we usually work. The substrate temperature essentially influences only the crystallite size.

The insights apply not only for Al-based layers and they apply only for binary oxides. As the one skilled in the art will recognize, the methods described above disclose a nice tool for being able to perform also layer design for completely different applications from the tool or component field (ferroelectrica, superconductor, catalyzers, barriers, . . . ).

In particular, the invention can be used for the following applications:
1. Tools:
   disposable inserts on the basis of hard metal, cermet, boron nitride, silicon nitride or silicon carbide for milling, turning or drilling
   milling cutters such as ball-headed cutters and end mill cutters
   thread milling cutters
   hob cutters
   drills
   screw taps
   borers
   engraving tools
2. Forming and stamping tools:
   forms for aluminum pressure die casting
   forms for plastic coating
   extrusion dies
   tools for sheet forming
   stamps for stamping metals
   smith's jaws, especially for hot forging
   tools for hot crimping
3. Components and parts in motor vehicle and especially in the motor industry:
   valves
   key tappets
   bushing needles
   valve rockers
   tappets
   roller spindles
   rocker fingers
   cam followers
   camshafts
   camshaft bearings
   valve tappets
   tilting levers
   piston rings
   piston pins
   injectors and injector parts
   turbine blades
   pump parts
   high-pressure pump
   gears
   gear wheels
   thrust washer
   components of electric control and acceleration system
   components in ABS system
   bearings
   ball bearings
   roller bearing
   camshaft bearing

The invention claimed is:

1. A method for producing oxidic layers by means of physical vapor deposition (PVD), comprising:
   forming a powder-metallurgical target comprising a composition from the group consisting of AlV, with Al ranging from 92 at % to 97 at % and V ranging from to 3 at % to 8 at %, and AlCr, with Al ranging from 80 at % to 90 at % and Cr ranging from 10 at % to 20 at %, the composition being chosen in such a manner that during heating in a transition from room temperature into a liquid phase no phase boundary of purely solid phases, based on a phase diagram of a molten mixture of the composition, is crossed; and
   vaporizing the powder-metallurgical target by means of cathodic arc vaporization in a reactive atmosphere comprising oxygen as reactive gas in order to produce the oxidic layers.

2. The method according to claim 1, wherein the oxidic layer has a proportion of more than 70 at % aluminum oxide in corundum structure by using the powder-metallurgical target, and
   wherein the composition of the powder-metallurgical target has a transition into the liquid phase between 1000° C. and 1200° C.

3. The method according to claim 1, wherein the powder-metallurgical target has particle sizes less than 300 µm.

4. The method according to claim 1, wherein, when the oxidic layers include ternary or higher oxides stable at high temperature, the composition of the powder-metallurgical target is chosen in such a way that, according to the phase diagram of the molten mixture of the composition, with the transition into the liquid phase, a formation temperature is essentially determined.

5. The method according to claim 1, wherein, while avoiding splatters, primary powders from phase mixtures are used for the forming of the powder-metallurgical target, each of the primary powders having a composition for which, during heating in the transition from the room temperature into the liquid phase, no phase boundaries of purely solid phases are crossed.

6. The method according to claim 3, wherein the particle sizes are less than 200 µm.

7. The method according to claim 3, wherein the particle sizes are less than 100 µm.

8. The method according to claim 1, wherein the powder-metallurgical target consists essentially of the composition from the group consisting of AlV, with Al ranging from 92 at % to 97 at % and V ranging from to 3 at % to 8 at %, and AlCr, with Al ranging from 80 at % to 90 at % and Cr ranging from 10 at % to 20 at %.

* * * * *